United States Patent
Whetsel

(10) Patent No.: US 6,728,915 B2
(45) Date of Patent: Apr. 27, 2004

(54) IC WITH SHARED SCAN CELLS SELECTIVELY CONNECTED IN SCAN PATH

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 422 days.

(21) Appl. No.: 09/758,089

(22) Filed: Jan. 10, 2001

(65) Prior Publication Data

US 2001/0025356 A1 Sep. 27, 2001

Related U.S. Application Data

(60) Provisional application No. 60/175,181, filed on Jan. 10, 2000.

(51) Int. Cl.$^7$ .............................................. G01R 31/28
(52) U.S. Cl. ...................... 714/727; 714/729; 714/730
(58) Field of Search .............................. 714/726, 727, 714/729, 730

(56) References Cited

U.S. PATENT DOCUMENTS

| | | | |
|---|---|---|---|
| 3,633,100 A | 1/1972 | Heilweil et al. | 324/73 |
| 3,651,315 A | 3/1972 | Collins | 235/151.31 |
| 3,657,527 A | 4/1972 | Kassabgi et al. | 235/153 |
| 3,723,868 A | 3/1973 | Foster | 324/73 AT |
| 3,739,193 A | 6/1973 | Pryor | 307/205 |
| 3,789,359 A | 1/1974 | Clark, Jr. et al. | 340/146.1 D |
| 3,824,678 A | 7/1974 | Harris et al. | 29/578 |
| 3,826,909 A | 7/1974 | Ivashin | 235/153 AC |
| 3,831,149 A | 8/1974 | Job | 340/172.5 |
| 3,838,264 A | 9/1974 | Maker | 235/153 AM |

(List continued on next page.)

FOREIGN PATENT DOCUMENTS

| | | | |
|---|---|---|---|
| EP | 0 136 174 | 4/1985 | G06F/9/30 |
| EP | 0148403 | 7/1985 | G01R/31/28 |
| EP | 0190494 | 8/1986 | G01R/31/28 |
| EP | 0195164 | 9/1986 | G01R/31/28 |
| EP | 0273821 | 7/1988 | G01R/31/28 |
| EP | 0310152 | 4/1989 | G01R/31/28 |
| EP | 0315475 A2 | 10/1989 | G01R/31/28 |
| EP | 0518550 A2 | 12/1992 | G06F/375/86 |
| EP | 0522413 A2 | 1/1993 | G06F/375/86 |
| EP | 0604032 A2 | 6/1994 | G06F/375/86 |

(List continued on next page.)

OTHER PUBLICATIONS

Adshead, Dave, "Embedded Systems: JTAG Accelerates Debugging Process," Electronic Engineering Times, Jun. 22, 1998, pp 106.

Avra, LaNae, "A VHSIC ETM–Bus Compatible Test and Maintenance Interface", 1987 International Test Conference, Sep. 1–3, 1987, Paper 41.2, pp. 964–971.

(List continued on next page.)

Primary Examiner—Albert Decady
Assistant Examiner—Joseph D. Torres
(74) Attorney, Agent, or Firm—Lawrence J. Bassuk; W. James Brady; Frederick J. Telecky, Jr.

(57) ABSTRACT

This patent describes a boundary scan system where memories, i.e. flip flops or latches, used in data scan cells are also used functionally, but memories used in control scan cells are dedicated for test and not used functionally. The control scan cells can be scanned while the circuit is in functional mode, since their memories are dedicated. However, the data scan cells can only be scanned after the circuit transitions into test mode, since their memories are shared. This boundary scan system advantageously provides; (1) lower test circuitry overhead since the data scan cells use shared memories, (2) safe entry into test mode since the control scan cells can be scanned during functional mode to pre-load safe control conditions, and (3) avoidance of floating (i.e. 3-state) busses that can cause high current situations.

4 Claims, 6 Drawing Sheets

U.S. PATENT DOCUMENTS

| | | | | |
|---|---|---|---|---|
| 3,873,818 | A | 3/1975 | Barnard | 253/153 AC |
| 3,976,940 | A | 8/1976 | Chau et al. | 324/73 R |
| 4,023,142 | A | 5/1977 | Woessner | 340/172.5 |
| 4,066,882 | A | 1/1978 | Esposito | 235/302 |
| 4,086,375 | A | 4/1978 | LaChapelle, Jr. et al. | 427/90 |
| 4,092,733 | A | 5/1978 | Coontz et al. | 365/200 |
| 4,108,359 | A | 8/1978 | Proto | 235/304 |
| 4,146,835 | A | 3/1979 | Chnapko et al. | 324/73 R |
| 4,161,276 | A | 7/1979 | Sacher et al. | 235/302 |
| 4,216,539 | A | 8/1980 | Raymond et al. | 371/20 |
| 4,242,751 | A | 12/1980 | Henckels et al. | 371/26 |
| 4,264,807 | A | 4/1981 | Moen et al. | 235/92 GD |
| 4,268,902 | A | 5/1981 | Berglund et al. | 364/200 |
| 4,286,173 | A | 8/1981 | Oka et al. | 307/440 |
| 4,308,616 | A | 12/1981 | Timoc | 371/23 |
| 4,309,767 | A | 1/1982 | Andow et al. | 371/24 |
| 4,312,066 | A | 1/1982 | Bantz et al. | 371/16 |
| 4,339,710 | A | 7/1982 | Hapke | 324/73 R |
| RE31,056 | E | 10/1982 | Chau et al. | 324/73 R |
| 4,357,703 | A | 11/1982 | Van Brunt | 371/15 |
| 4,365,334 | A | 12/1982 | Smith et al. | 371/27 |
| 4,366,478 | A | 12/1982 | Masuda et al. | 340/825 |
| 4,390,969 | A | 6/1983 | Hayes | 395/550 |
| 4,426,697 | A | 1/1984 | Petersen et al. | 340/825.52 |
| 4,433,413 | A | 2/1984 | Fasang | 371/25 |
| 4,439,858 | A | 3/1984 | Petersen | 371/20 |
| 4,441,075 | A | 4/1984 | McMahon | 324/73 R |
| 4,483,002 | A | 11/1984 | Groom, Jr. et al. | 371/29 |
| 4,484,329 | A | 11/1984 | Slamka et al. | 371/25 |
| 4,488,259 | A | 12/1984 | Mercy | 364/900 |
| 4,493,077 | A | 1/1985 | Agrawal et al. | 371/25 |
| 4,494,066 | A | 1/1985 | Goel et al. | 324/73 R |
| 4,498,172 | A | 2/1985 | Bhavsar | 371/25 |
| 4,503,536 | A | 3/1985 | Panzer | 371/25 |
| 4,504,784 | A | 3/1985 | Goel et al. | 324/73 R |
| 4,513,373 | A | 4/1985 | Sheets | 364/200 |
| 4,513,418 | A | 4/1985 | Bardell, Jr. et al. | 371/25 |
| 4,514,845 | A | 4/1985 | Starr | 371/15 |
| 4,519,078 | A | 5/1985 | Komonytsky | 371/25 |
| 4,534,028 | A | 8/1985 | Trischler | 371/25 |
| 4,553,090 | A | 11/1985 | Hatano et al. | 324/73 AT |
| 4,575,674 | A | 3/1986 | Bass et al. | 324/73 R |
| 4,577,318 | A | 3/1986 | Whitacre et al. | 371/1 |
| 4,587,609 | A | 5/1986 | Boudreau et al. | 395/726 |
| 4,594,711 | A | 6/1986 | Thatte | 371/25 |
| 4,597,042 | A | 6/1986 | d'Angeac | 364/200 |
| 4,597,080 | A | 6/1986 | Thatte et al. | 371/25 |
| 4,598,401 | A | 7/1986 | Whelan | 371/25 |
| 4,601,034 | A | 7/1986 | Sridhar | 371/25 |
| 4,602,210 | A | 7/1986 | Fasang et al. | 324/73 |
| 4,612,499 | A | 9/1986 | Andresen et al. | 324/73 R |
| 4,615,029 | A | 9/1986 | Hu et al. | 370/89 |
| 4,618,956 | A | 10/1986 | Horst | 371/68 |
| 4,621,363 | A | 11/1986 | Blum | 371/25 |
| 4,627,018 | A | 12/1986 | Trost et al. | 395/476 |
| 4,628,511 | A | 12/1986 | Stitzlein et al. | 371/22 |
| 4,635,193 | A | 1/1987 | Moyer et al. | 364/200 |
| 4,635,261 | A | 1/1987 | Anderson et al. | 371/25 |
| 4,638,313 | A | 1/1987 | Sherwood et al. | 340/825.52 |
| 4,642,561 | A | 2/1987 | Groves et al. | 324/73 R |
| 4,646,298 | A | 2/1987 | Laws et al. | 371/16 |
| 4,646,299 | A | 2/1987 | Schinabeck et al. | 371/20 |
| 4,651,088 | A | 3/1987 | Sawada | 324/73 R |
| 4,669,061 | A | 5/1987 | Bhavsar | 365/154 |
| 4,672,307 | A | 6/1987 | Breuer et al. | 324/73 R |
| 4,674,089 | A | 6/1987 | Poret et al. | 371/25 |
| 4,679,192 | A | 7/1987 | Vanbrabant | 340/825.52 |
| 4,680,539 | A | 7/1987 | Tsai | 324/73 |
| 4,680,733 | A | 7/1987 | Duforestel | 364/900 |
| 4,683,569 | A | 7/1987 | Rubin | 371/25 |
| 4,687,988 | A | 8/1987 | Eichelberger et al. | 324/73 AT |
| 4,694,293 | A | 9/1987 | Sugiyama et al. | 340/825.68 |
| 4,698,588 | A | 10/1987 | Hwang et al. | 324/73 R |
| 4,701,916 | A | 10/1987 | Naven et al. | 371/15 |
| 4,701,920 | A | 10/1987 | Resnick et al. | 371/25 |
| 4,701,921 | A | 10/1987 | Powell et al. | 371/25 |
| 4,710,931 | A | 12/1987 | Bellay et al. | 371/25 |
| 4,710,932 | A | 12/1987 | Hiroshi | 371/25 |
| 4,710,933 | A | 12/1987 | Powell et al. | 371/25 |
| 4,734,921 | A | 3/1988 | Giangano et al. | 377/72 |
| 4,740,970 | A | 4/1988 | Burrows et al. | 371/15 |
| 4,743,841 | A | 5/1988 | Takeuchi | 324/73 R |
| 4,745,355 | A | 5/1988 | Eichelberger et al. | 324/73 R |
| 4,752,929 | A | 6/1988 | Kantz et al. | 371/21 |
| 4,759,019 | A | 7/1988 | Bentley et al. | 371/3 |
| 4,763,066 | A | 8/1988 | Yeung et al. | 324/73 R |
| 4,764,926 | A | 8/1988 | Knight et al. | 371/25 |
| 4,777,616 | A | 10/1988 | Moore et al. | 364/900 |
| 4,783,785 | A | 11/1988 | Hanta | 371/25 |
| 4,788,683 | A | 11/1988 | Hester et al. | 371/20 |
| 4,791,358 | A | 12/1988 | Sauerwald et al. | 324/73 R |
| 4,799,004 | A | 1/1989 | Mori | 324/73 R |
| 4,799,052 | A | 1/1989 | Near et al. | 340/825.52 |
| 4,800,418 | A | 1/1989 | Natsui | 357/68 |
| 4,801,870 | A | 1/1989 | Eichelberger et al. | 371/22.4 |
| 4,802,163 | A | 1/1989 | Hirabayashi | 371/15 |
| 4,808,844 | A | 2/1989 | Ozaki et al. | 307/243 |
| 4,811,299 | A | 3/1989 | Miyazawa et al. | 365/201 |
| 4,812,678 | A | 3/1989 | Abe | 307/443 |
| 4,817,093 | A | 3/1989 | Jacobs et al. | 371/25 |
| 4,819,234 | A | 4/1989 | Huber | 371/19 |
| 4,821,269 | A | 4/1989 | Jackson et al. | 371/16 |
| 4,825,439 | A | 4/1989 | Sakashita et al. | 371/15 |
| 4,833,395 | A | 5/1989 | Sasaki et al. | 324/73 R |
| 4,833,676 | A | 5/1989 | Koo | 371/15 |
| 4,855,954 | A | 8/1989 | Turner et al. | 365/185 |
| 4,857,835 | A | 8/1989 | Whetsel, Jr. | 324/73 |
| 4,860,288 | A | 8/1989 | Teske et al. | 371/1 |
| 4,860,290 | A | 8/1989 | Daniels et al. | 371/25 |
| 4,862,071 | A | 8/1989 | Sato et al. | 324/73 R |
| 4,862,072 | A | 8/1989 | Harris et al. | 324/73 R |
| 4,864,570 | A | 9/1989 | Savaglio et al. | 371/22.4 |
| 4,864,579 | A | 9/1989 | Kishida et al. | 371/22.3 |
| 4,866,508 | A | 9/1989 | Eichelberger et al. | 357/74 |
| 4,870,345 | A | 9/1989 | Tomioka et al. | 371/22.3 |
| 4,872,169 | A | 10/1989 | Whetsel | 371/22.3 |
| 4,875,003 | A | 10/1989 | Burke | 324/73 R |
| 4,878,168 | A | 10/1989 | Johnson et al. | 364/200 |
| 4,879,717 | A | 11/1989 | Sauerwald et al. | 371/22.3 |
| 4,887,262 | A | 12/1989 | van Veldhuizen | 370/85.1 |
| 4,887,267 | A | 12/1989 | Kanuma | 371/22.3 |
| 4,893,072 | A | 1/1990 | Matsumoto | 371/223 |
| 4,894,830 | A | 1/1990 | Kawai | 371/22.3 |
| 4,896,262 | A | 1/1990 | Wayama et al. | 364/200 |
| 4,897,842 | A | 1/1990 | Herz et al. | 371/22.4 |
| 4,899,273 | A | 2/1990 | Omoda et al. | 364/200 |
| 4,903,266 | A | 2/1990 | Hack | 371/21.2 |
| 4,907,230 | A | 3/1990 | Heller et al. | 371/22.1 |
| 4,910,735 | A | 3/1990 | Yamashita | 371/22.4 |
| 4,912,633 | A | 3/1990 | Schweizer et al. | 364/200 |
| 4,912,709 | A | 3/1990 | Teske et al. | 371/22.1 |
| 4,918,379 | A | 4/1990 | Jongepier | 324/73.1 |
| 4,924,468 | A | 5/1990 | Horak et al. | 371/22.1 |
| 4,926,425 | A | 5/1990 | Hedtke et al. | 371/22.6 |
| 4,929,889 | A | 5/1990 | Seiler et al. | 371/22.3 |
| 4,930,216 | A | 6/1990 | Nelson | 29/854 |
| 4,931,722 | A | 6/1990 | Stoica | 371/22.5 |
| 4,931,723 | A | 6/1990 | Jeffrey et al. | 371/22.3 |
| 4,935,868 | A | 6/1990 | DuLac | 364/200 |
| 4,937,826 | A | 6/1990 | Gheewala et al. | 371/22.1 |
| 4,943,966 | A | 7/1990 | Giunta et al. | 371/11.1 |

| Patent | Date | Inventor | Class |
|---|---|---|---|
| 4,945,536 A | 7/1990 | Hancu | 371/22.3 |
| 4,947,106 A | 8/1990 | Chism | 324/73.1 |
| 4,947,357 A | 8/1990 | Stewart et al. | 371/22.3 |
| 4,956,602 A | 9/1990 | Parrish | 324/158 R |
| 4,961,053 A | 10/1990 | Krug | 324/158 R |
| 4,969,121 A | 11/1990 | Chan et al. | 364/900 |
| 4,974,192 A | 11/1990 | Face et al. | 364/900 |
| 4,974,226 A | 11/1990 | Fujimori et al. | 371/22.3 |
| 4,989,209 A | 1/1991 | Littlebury et al. | 371/22.1 |
| 4,992,985 A | 2/1991 | Miyazawa et al. | 365/201 |
| 5,001,713 A | 3/1991 | Whetsel | 371/22.3 |
| 5,008,618 A | 4/1991 | Van Der Star | 324/158 R |
| 5,008,885 A | 4/1991 | Huang et al. | 371/3 |
| 5,012,185 A | 4/1991 | Ohfuji | 324/158 R |
| 5,014,186 A | 5/1991 | Chisholm | 395/850 |
| 5,023,872 A | 6/1991 | Annamalai | 371/5.1 |
| 5,042,005 A | 8/1991 | Miller et al. | 364/900 |
| 5,048,021 A | 9/1991 | Jarwala et al. | 371/22.3 |
| 5,051,996 A | 9/1991 | Bergeson et al. | 371/22.4 |
| 5,053,949 A | 10/1991 | Allison et al. | 364/200 |
| 5,054,024 A | 10/1991 | Whetsel | 371/22.3 |
| 5,056,093 A | 10/1991 | Whetsel | 371/22.3 |
| 5,056,094 A | 10/1991 | Whetsel | 371/25.1 |
| 5,070,296 A | 12/1991 | Priebe | 324/73.1 |
| 5,070,297 A | 12/1991 | Kwon et al. | 324/158 P |
| 5,077,740 A | 12/1991 | Kanuma | 371/22.3 |
| 5,084,814 A | 1/1992 | Vaglica et al. | 395/325 |
| 5,084,874 A | 1/1992 | Whetsel | 371/22.3 |
| 5,090,015 A | 2/1992 | Dabbish et al. | 371/22.5 |
| 5,090,035 A | 2/1992 | Murase | 377/72 |
| 5,107,148 A | 4/1992 | Millman | 307/473 |
| 5,107,489 A | 4/1992 | Brown et al. | 370/58.2 |
| 5,109,190 A | 4/1992 | Sakashita et al. | 324/158 R |
| 5,109,383 A | 4/1992 | Chujo | 371/22.3 |
| 5,115,191 A | 5/1992 | Yoshimori | 324/158 R |
| 5,115,435 A | 5/1992 | Langford, II et al. | 371/22.1 |
| 5,126,286 A | 6/1992 | Chance | 437/203 |
| 5,128,664 A | 7/1992 | Bishop | 340/825.52 |
| 5,130,988 A | 7/1992 | Wilcox et al. | 371/22.3 |
| 5,132,635 A | 7/1992 | Kennedy | 371/22.3 |
| 5,133,062 A | 7/1992 | Joshi et al. | 395/500 |
| 5,134,314 A | 7/1992 | Wehrmacher | 307/443 |
| 5,150,044 A | 9/1992 | Hashizume et al. | 324/158 R |
| 5,150,047 A | 9/1992 | Saito et al. | 324/158 R |
| 5,155,432 A | 10/1992 | Mahoney | 324/158 R |
| 5,159,465 A | 10/1992 | Maemura et al. | 326/73 |
| 5,161,160 A | 11/1992 | Yaguchi et al. | 371/22.3 |
| 5,165,022 A | 11/1992 | Erhard et al. | 395/275 |
| 5,167,020 A | 11/1992 | Kahn et al. | 395/250 |
| 5,170,398 A | 12/1992 | Fujieda et al. | 371/27 |
| 5,172,377 A | 12/1992 | Robinson et al. | 371/22.3 |
| 5,173,906 A | 12/1992 | Dreibelbis et al. | 371/22.5 |
| 5,175,447 A | 12/1992 | Kawasaki et al. | 307/480 |
| 5,187,795 A | 2/1993 | Balmforth et al. | 395/800 |
| 5,191,653 A | 3/1993 | Banks et al. | 395/275 |
| 5,202,625 A | 4/1993 | Farwell | 324/158 R |
| 5,206,545 A | 4/1993 | Huang | 307/443 |
| 5,210,759 A | 5/1993 | DeWitt et al. | 371/22.3 |
| 5,214,760 A | 5/1993 | Hammond et al. | 395/250 |
| 5,214,774 A | 5/1993 | Welsch et al. | 455/11.1 |
| 5,218,702 A | 6/1993 | Kirtland | 395/298 |
| 5,241,265 A | 8/1993 | McDonnell et al. | 324/158 R |
| 5,241,266 A | 8/1993 | Ahmad et al. | 324/158 R |
| 5,252,917 A | 10/1993 | Kadowaki | 324/158 R |
| 5,254,942 A | 10/1993 | D'Souza et al. | 324/158 R |
| 5,258,985 A | 11/1993 | Spence et al. | 371/22.4 |
| 5,260,949 A | 11/1993 | Hashizumw et al. | 371/22.3 |
| 5,276,807 A | 1/1994 | Kodama et al. | 395/309 |
| 5,278,494 A | 1/1994 | Obigane | 324/158 F |
| 5,279,975 A | 1/1994 | Devereaux et al. | 437/8 |
| 5,286,656 A | 2/1994 | Keown et al. | 437/7 |
| 5,291,025 A | 3/1994 | Smith | 250/561 |
| 5,297,277 A | 3/1994 | Dein et al. | 395/575 |
| 5,303,148 A | 4/1994 | Mattson et al. | 364/413.01 |
| 5,313,158 A | 5/1994 | Joosten et al. | 324/158 R |
| 5,315,241 A | 5/1994 | Ewers | 324/158 R |
| 5,317,205 A | 5/1994 | Sato | 307/443 |
| 5,319,754 A | 6/1994 | Meinecke et al. | 395/325 |
| 5,321,322 A | 6/1994 | Verheyen et al. | 307/465.1 |
| 5,329,471 A | 7/1994 | Swoboda et al. | 364/578 |
| 5,334,857 A | 8/1994 | Mennitt et al. | 257/48 |
| 5,343,478 A | 8/1994 | James et al. | 371/22.3 |
| 5,353,308 A | 10/1994 | Whetsel | 371/22.3 |
| 5,355,369 A | 10/1994 | Greenbergerl et al. | 371/22.3 |
| 5,366,906 A | 11/1994 | Wojnarowski et al. | 437/8 |
| 5,371,390 A | 12/1994 | Mohsen | 257/209 |
| 5,377,198 A | 12/1994 | Simpson et al. | 371/22.3 |
| 5,388,216 A | 2/1995 | Oh | 395/849 |
| 5,389,556 A | 2/1995 | Rostoker et al. | 437/8 |
| 5,389,873 A | 2/1995 | Ishii et al. | 324/158.1 |
| 5,390,131 A | 2/1995 | Rohrbaugh et al. | 364/490 |
| 5,391,984 A | 2/1995 | Worley | 324/158.1 |
| 5,396,170 A | 3/1995 | D'Souza et al. | 324/158.1 |
| 5,399,505 A | 3/1995 | Dasse et al. | 437/8 |
| 5,420,874 A | 5/1995 | Kromer | 371/47.1 |
| 5,424,651 A | 6/1995 | Green et al. | 324/754 |
| 5,426,650 A | 6/1995 | Ganapathy et al. | 371/22.3 |
| 5,428,622 A * | 6/1995 | Kuban et al. | 714/729 |
| 5,430,735 A | 7/1995 | Sauerwald et al. | 371/22.3 |
| 5,434,804 A | 7/1995 | Bock et al. | 364/579 |
| 5,442,282 A | 8/1995 | Rostoker et al. | 324/158.1 |
| 5,446,395 A | 8/1995 | Goto | 324/763 |
| 5,448,576 A | 9/1995 | Russell | 371/22.3 |
| 5,450,415 A | 9/1995 | Kamada | 371/22.3 |
| 5,453,992 A | 9/1995 | Whetsel | 371/22.3 |
| 5,457,400 A | 10/1995 | Ahmad et al. | 324/763 |
| 5,469,473 A | 11/1995 | McClear et al. | 375/219 |
| 5,471,481 A | 11/1995 | Okumoto et al. | 371/22.3 |
| 5,481,734 A | 1/1996 | Yoshida | 395/775 |
| 5,483,518 A | 1/1996 | Whetsel | 370/13 |
| 5,488,614 A | 1/1996 | Shima | 371/22.3 |
| 5,488,728 A | 1/1996 | Dreyer | 395/726 |
| 5,489,538 A | 2/1996 | Rostoker et al. | 437/8 |
| 5,490,151 A | 2/1996 | Feger et al. | 371/22.3 |
| 5,491,666 A | 2/1996 | Sturges | 365/201 |
| 5,491,699 A | 2/1996 | Scheuermann et al. | 371/22.1 |
| 5,526,310 A | 6/1996 | Dondale | 365/196 |
| 5,526,365 A | 6/1996 | Whetsel | 371/22.3 |
| 5,532,174 A | 7/1996 | Corrigan | 437/8 |
| 5,534,786 A | 7/1996 | Kaneko et al. | 324/760 |
| 5,541,935 A | 7/1996 | Waterson | 371/22.5 |
| 5,544,174 A | 8/1996 | Abend | 371/22.3 |
| 5,548,781 A | 8/1996 | Huang | 395/831 |
| 5,550,843 A | 8/1996 | Yee | 371/22.3 |
| 5,557,573 A | 9/1996 | McClure | 365/201 |
| 5,568,492 A | 10/1996 | Flint et al. | 371/22.1 |
| 5,576,980 A | 11/1996 | Whetsel | 364/579 |
| 5,590,275 A | 12/1996 | Van Berkel et al. | 395/183.06 |
| 5,592,493 A | 1/1997 | Crouch et al. | 371/22.3 |
| 5,608,335 A | 3/1997 | Tailliet | 324/763 |
| 5,608,736 A | 3/1997 | Bradford et al. | 371/22.3 |
| 5,610,530 A | 3/1997 | Whetsel | 324/763 |
| 5,610,826 A | 3/1997 | Whetsel | 364/487 |
| 5,619,462 A | 4/1997 | McClure | 365/201 |
| 5,623,500 A | 4/1997 | Whetsel | 371/22.1 |
| 5,627,839 A | 5/1997 | Whetsel | 371/22.3 |
| 5,648,661 A | 7/1997 | Rostoker et al. | 257/48 |
| 5,659,257 A | 8/1997 | Lu et al. | 324/763 |
| 5,659,773 A | 8/1997 | Huynh et al. | 395/821 |
| 5,677,915 A | 10/1997 | Whetsel | 371/22.3 |
| 5,685,004 A | 11/1997 | Bruce et al. | 395/800 |
| 5,687,179 A | 11/1997 | Whetsel et al. | 371/22.3 |

| | | | |
|---|---|---|---|
| 5,701,307 A | 12/1997 | Whetsel | 371/22.3 |
| 5,706,235 A | 1/1998 | Roohparvar et al. | 365/201 |
| 5,710,779 A | 1/1998 | Whetsel | 371/22.3 |
| 5,715,171 A | 2/1998 | Mori et al. | 364/490 |
| 5,715,254 A | 2/1998 | Whetsel | 371/22.3 |
| 5,715,255 A | 2/1998 | Whetsel | 371/22.3 |
| 5,719,876 A | 2/1998 | Warren | 371/22.3 |
| 5,719,878 A | 2/1998 | Yu et al. | 371/22.3 |
| 5,744,949 A | 4/1998 | Whetsel | 324/158.1 |
| 5,760,643 A | 6/1998 | Whetsel | |
| 5,802,270 A | 9/1998 | Ko et al. | 395/183.03 |
| 5,805,792 A | 9/1998 | Swoboda et al. | 395/183.04 |
| 5,825,785 A | 10/1998 | Barry et al. | 371/22.4 |
| 5,828,825 A | 10/1998 | Eskandari et al. | 395/183.03 |
| 5,841,670 A | 11/1998 | Swoboda | 364/578 |
| 5,841,791 A * | 11/1998 | Hashizume | 714/726 |
| 5,847,561 A | 12/1998 | Whetsel | 324/158.1 |
| 5,862,152 A | 1/1999 | Handly et al. | 371/22.32 |
| 5,872,908 A | 2/1999 | Whetsel | 395/183.06 |
| 5,883,524 A | 3/1999 | Whetsel | 326/16 |
| 5,884,023 A | 3/1999 | Swoboda et al. | 395/183.06 |
| 5,887,004 A | 3/1999 | Walther | 371/22.31 |
| 5,905,738 A | 5/1999 | Whetsel | 371/22.4 |
| 5,907,562 A | 5/1999 | Wrape et al. | 371/22.31 |
| 5,958,072 A | 9/1999 | Jacobs et al. | 714/30 |
| 5,968,191 A | 10/1999 | Thatcher et al. | 714/723 |
| 5,968,192 A | 10/1999 | Kornachuk et al. | 714/724 |
| 6,000,051 A | 12/1999 | Nadeau-Dostie et al. | 714/727 |
| 6,028,983 A | 2/2000 | Jaber | 395/183.06 |
| 6,037,794 A | 3/2000 | Yamamoto et al. | 324/760 |
| 6,073,254 A | 6/2000 | Whetsel | 714/30 |
| 6,115,763 A | 9/2000 | Douskey et al. | 710/72 |
| 6,158,035 A | 12/2000 | Whetsel et al. | 714/731 |
| 6,199,182 B1 | 3/2001 | Whetsel | 714/724 |
| 6,223,315 B1 | 4/2001 | Whetsel | 714/727 |
| 6,242,269 B1 | 6/2001 | Whetsel | 438/11 |
| 6,260,165 B1 | 7/2001 | Whetsel | 714/727 |
| 6,286,121 B1 * | 9/2001 | Osawa et al. | 714/738 |
| 6,311,302 B1 | 10/2001 | Cassetti et al. | 714/727 |
| 6,324,614 B1 | 11/2001 | Whetsel | 710/130 |
| 6,324,662 B1 | 11/2001 | Haroun et al. | 714/724 |
| 6,343,365 B1 * | 1/2002 | Matsuzawa et al. | 714/726 |
| 6,446,230 B1 * | 9/2002 | Chung | 714/726 |
| 6,457,148 B1 | 9/2002 | Yoshiba | 714/718 |

FOREIGN PATENT DOCUMENTS

| | | | |
|---|---|---|---|
| GB | 2220272 A | 1/1990 | G01R/31/28 |
| GB | 2266965 A | 11/1993 | G01R/31/28 |
| JP | 57-094857 A | 6/1982 | G06F/375/82 |
| JP | 57-209546 | 12/1982 | G06F/11/20 |
| JP | 58-155599 | 9/1983 | |
| JP | 58-191021 A | 11/1983 | G06F/365/86 |
| JP | 59-210382 | 11/1984 | G01R/31/28 |
| JP | 60-140834 A | 7/1985 | H01L/21/66 |
| JP | 60-252958 | 12/1985 | G06F/11/22 |
| JP | 60-262073 | 12/1985 | G01R/31/28 |
| JP | 62-031447 A | 2/1987 | G06F/375/82 |
| JP | 62-228177 | 10/1987 | G01R/31/28 |
| JP | 62-280663 | 12/1987 | G01R/31/28 |
| JP | 63-073169 | 4/1988 | G01R/31/28 |
| JP | 63-188783 A | 8/1988 | G01R/31/28 |
| JP | 63-213014 A | 9/1988 | G06F/372/60 |
| JP | 63-310046 A | 12/1988 | G06F/376/06 |
| JP | 64-006572 | 1/1989 | G01R/31/28 |
| JP | 01-038674 A | 2/1989 | G01R/31/28 |
| JP | 01-043773 | 2/1989 | G01R/31/28 |
| JP | 01-068167 A | 3/1989 | H04M/3/22 |
| JP | 01-079673 A | 3/1989 | G01R/31/28 |
| JP | 01-110274 | 4/1989 | G01R/31/28 |
| JP | 01-170873 | 7/1989 | G01R/31/28 |
| JP | 02-016642 A | 1/1990 | G06F/11/22 |
| JP | 02-062984 | 3/1990 | G01R/31/28 |
| JP | 02-052165 | 4/1990 | G01R/13/28 |

OTHER PUBLICATIONS

Bhavasar, D., "An Architecture for Extending the IEEE Standard 1149.1 Test Access Port to System Backplanes", International Test Conference 1991, pp. 768–776.

Bhavsar, Dilip, "Chapter 17. Designs that Help Test Interconnect Shorts", IEEE, 1990, pp. 183–189.

Bhavsar, et al., "Self–Testing by Polynomial Division", Digest of Papers, International Test Conference, 1981, pp. 208–216.

Blair, Jack D.; Correale, Anthony, Jr.; Cranford, H. Clay; Dombrowski, Dave A.; Erdelyi, Charles K.; Hoffman, Charles R.; Lampere, Jeff L.; Lang, Kirk W.; Lee, Joseph, K.; Mullen, J. Mark; Norman, Vernon R.; Oakland, Steve F., "A 16–Mbit/s Adapter Chip for the IBM Token–Ring Local Area Network", IEEE Journal of Solid–State Circuits, vol. 24, No. 6, Dec. 1989, pp. 1647–1654.

Breuer, Melvin A.; Lien, Jung–Cheun, "A Test and Maintenance Controller for a Module Containing Testable Chips", 1988 International Test Conference, Sep. 12–14, 1988, Paper 27.1, pp. 502–513.

Bruce, W. C., et al., "Implementing 1149.1 on CMOS Processors", IEEE International Test Conference 1992, Paper BP–91, pp. 999–1006.

Carbine, Adrian and Feltham, Derek, "Pentium Pro Processor Design for Test and Debug," International Test Conference 1997, Nov. 1–6, 1997, pp. 294–303, IEEE Computer Society.

Colwell, Robert P. and Steck, Randy L., "TP 10.4: A 0.6um BiCMOS Processor with Dynamic Execution," 1995 IEEE International Solid–State Circuits Conference, Feb. 15–17, 1995, pp. 176–177.

Dervisoglu, Bulent I., "Using Scan Technology for Debug and Diagnostics in a Workstation Environment", 1988 International Test Conference, Sep. 12–14, 1988, Paper 45.2, pp.976–986.

Dervisoglu, Bulent, "IEEE P1149.2 Description and Status Report", IEEE Design and Test of Computers, Sep., 1992, pp. 79–81.

Dervisoglu, Bulent, et al., "Shared I/O–Cell Structures: A Framework for Extending the IEEE 1149.1 Boundary–Scan Standard", Int'l Test Conference, Oct. 19, 1998, pp. 908–989.

El–ziq, et al., "A Mixed–Mode Built–In Self–Test Technique Using Scan Path and Signature Analysis", International Test Conference, Oct. 18–20, 1983, pp. 269–274.

ETM–Bus Specification, VHSIC Phase 2 Interoperability Standards, Dec. 31, 1985, Version 1.0.

George, David, "Use a reprogramable approach to boundary scan for FPGAs", EDN, Electrical Design News, vol. 38, No. 16, Aug. 5, 1993, pp. 97–104.

Gerstendorfer, S. et al. "Minimized Power Consumption for Scan–Based BIST", Proceedings International Test Conference, Sep. 28–30, 1999 (IEEE Cat. No. 99CH37034) pp. 77–84.

Gott, Robert A., "Embedded Systems: Debugging Embedded Software," pp. 71–73, 76, 78, Computer Design, Feb. 1998.

Haedtke, et al., "Multilevel Self–test for the Factory and Field", Proceedings, Annual Relaibility and Maintainability Symposium, 1987.

Hahn, et al., "VLSI Testing By On–Chip Error Detection", IBM Technical Disclosure Bulletin, vol. 25, No. 2, Jul. 1982.

Heatherington, G. et al., "Logic BIST for Large Industrial Designs: Real Issues and Case Studies," Proceedings International Test Conference, Sep. 28, 1999, IEEE vol. CONF. 30, pp. 358–367.

Hudson, et al., "Integrating BIST And Boundary–Scan On A Board", Proceedings of the National Communications Forum, Sep. 30, 1988, pp. 1796–1800.

Hudson, et al., "Parallel Self–test With Pseudo–Random Test Patterns", International Test Conference, Sep. 1–3, 1987, pp. 954–963.

IBM Technical Disclosure Bulletin, "Bidirectional Double Latch", vol. 28, No. 1, Jun., 1985.

IBM Technical Disclosure Bulletin, "Self–Contained IBM Performance Monitor for a Personal Computer", Dec., 1988, vol. 3, No. 7, pp. 376–377.

IBM Technical Disclosure Bulletin, "Test Bus Architecture", vol. 32, No. 3A, Aug. 1989, pp. 21–27.

IEEE P1149.2—D2.5, "Extended Digital Serial Subset", Unapproved Draft Published for Comment Only, Aug. 30, 1994, pp. 1/37.

Intel, "80386 Programmer's Reference Manual 1986", Chapter 12: Debugging, pp. 12–1–12.9, Jan. 18, 1988.

Intel, "Intel386™ DX Microprocessor Data Sheet," Section 2.11: Testability, 1988.

Intel, "Microprocessor and Peripheral Handbook", 80386 Preliminary, Section 2.11: Testability, 1988.

Jarwala, Madhuri, "A Framework for Design for Testability of Mixed Analog/Digital Circuits", IEEE 1991 Custom Integrated Circuits Conference, pp. 13.5.1–4.

Joint Test Action Group, Technical Sub–Committee, "A Standard Boundary Scan Architecture", Jan. 1988.

Kuban, John R. and Bruce, William C, "Self–Testing the Motorola MC6804P2," IEEE Design & Test, May, 1984, earlier version in International Test Conference Proceedings, Oct. 1983.

Laurent, "An Example of Test Strategy for Computer Implemented with VLSI Circuits", IEEE International Conference on Computer Design: VLSI in Computers, Oct. 7–10, 1985, pp. 679–682.

Lee, Nai–Chi, "A Hierarchical Analog Test Bus Framework for Testing Mixed–Signal Integrated Circuits and Printed circuit Boards", Journal of Electronic Testing: Theory and Applications, 4(1993), Nov., No. 4, Dordrecht, NE, pp. 361–368.

Lien, Jung–Cheun; Breuer, Melvin A., "A Universal Test and Maintenance Controller for Modules and Boards", IEEE Transactions on Industrial Electonics, vol. 36, No. 2, May 1989, pp. 231–240.

Lofstrom, Keith, "A Demonstration IC for the P1149.4 Mixed–Signal Test Standard", IEEE International Test Conference 1996, Paper 4.2, pp. 92–98.

Loftstrom, Keith, "Early Capture for Boundary Scan Timing Measurements", International Test Conference 1996, Oct. 20–25, 1996, pp. 417–422.

Maierhofer, J., "Heirarchial Self–Test Concept Based on the JTAG Standard", IEEE International Test Conference 1990, Paper 5.2, pp. 127–134.

Marlett, et al., "RISP Methodology", Electronic Engineering, Feb., 1989, pp. 45–48.

Maunder, Colin, and Beenker, Frans, "Boundary–Scan: A Framework for Structured Design–for–Test," paper 30.1, International Test Conference 1987 Proceedings, Sep. 1–3.

Mixed–Signal Working Group, "Standard for a Mixed Signal Test Bus", D11, Mar. 1997, pp. 1–51.

Ohletz, et al., "Overhead in Scan and Self–testing Designs", International Test Conference, 1987, Sep. 1–3, pp. 460–470.

Ohsawa, et al., "A 60–ns $–Mbit CMOS DRAM with Built–In self–Test Function", IEEE Journal of Solid–State Circuits, vol. SC–22, No. 5, Oct. 1987, pp. 663–668.

Paraskeva, et al., "New Test Structure for VLSI Self–Test: The Structured Test Register", 8030 Electronic Letters, 21 (1985) Sep. No. 19, Stenenage, Herts, Great Britain, Jul. 26, 1985.

Parker, "The Impact of Boundary Scan on Board Test", IEEE design & Test of Computers, Aug., 1989, pp. 18–30.

Parker, Kenneth, et al., "Structure and Methodology for an Analog Testability Bus", IEEE International Test Conference 1993, Paper 15.2, pp. 309–322.

Pradhan, M.M., et al., "Circular BIST with Partial Scan," 1988 International Test Conference, Sep. 12–14, 1987, Paper 35.1, pp. 719–727.

Russell, "The JTAG Proposal and Its Impact On Automatic Test", ATE & Instrumentation Conference, Sep., 1988, pp. 289–297.

Sabo, et al., "Genesil Silicon Compilation and Design For Testability", IEEE Custom Integrated Circuits Conference, May 12–15, 1986, pp. 416–420.

Sasidhar, K, Chatterjee, A., Zorian, Y., "Optimal Multiple Chain Relay Testing Scheme for MCMs on Large Area Substrates," 1996 IEEE International Test Conference, Paper 31.1, pp. 818–827.

Sasidhar, K, Chatterjee, A., Zorian, Y., Relay Propagation Scheme for Testing of MCMs on Large Area Substrates, 1996 IEEE 1066–1409/96, pp. 131–135.*

Sellers, et al., "Error Detecting Logic for Digital Computers", McGraw–Hill Co., 1968 pp. 207–211.*

Sharp, John, "JTAG Emulation Systems Explore Embedded Cores," pp. 62, Electronic Engineering Times, Jun. 15, 1998.*

Sunter, S.K., "Cost/Benefit Analysis of the P1149.4 Mixed–signal Test Bus", IEE Proceedings, Circuits, Devices, Systems, vol. 143, No. 6, Dec., 1996, pp. 393–398.*

Sunter, Stephen, "A Low Cost 100 MHz Analog Test Bus", IEEE 1995, pp. 60–65.*

Texas Instruments Data Book, 1991, "Advanced Logic Bus Interface Logic", pp. 11–3, 11–11,11–18, 11–19, 11–23, 11–82, 11–83, 11–84, 11–85.* van Riessen, R. P., Kerkhoff, H. G., Kloppenburg, A., "Design and Implementation of a Hierarchical Testable Architecture Using the Boundary Scan Standard", Proceedings, $1^{st}$ European Test Conference, Paris, France, Apr. 12–14, 1989, pp. 112–118.*

Wagner, "Interconnect Testing With Boundary Scan", International Test Conference Proceedings, 1987, Sep. 1–3, pp. 52–57.*

Wang, et al., "Concurrent Built–In Logic Block Observer (CBILBO)", IEEE International Symposium On Circuits and Systems, May 5–7, 1986, vol. 3, pp. 1054–1057.*

Wang, Laung–Terng; Marhoefer, Michael; McCluskey, Edward, J., "A Self–Test and Self–Diagnosis Architecture for Boards Using Boundary Scan", Proceedings $1^{st}$ European Test Conference, Paris, Apr. 12–14, 1989, pp. 119–126.*

Whetsel, , Lee, "An IEEE 1149.1 Based Test Access Architecture For ICs With Embedded Cores", International Test Conference 1997, Nov. 1–6, 1997, pp. 69–78.*

Whetsel, Lee, "A Proposed Standard Test Bus and Boundary Scan Architecture", IEEE International Conference on Computer Design: VLSI in Computers & Processes, Oct. 3–5, 1988, pp. 330–333.*

Whetsel, Lee, "A Standard Test Bus and Boundary Scan Architecture," pp. 48–59, Texas Instruments Technical Journal, Jul.–Aug. 1988, vol. 5, No. 4.*

Whetsel, Lee, "A View of the JTAG Port and Architecture", ATE & Instrumentation Conference West, Jan. 11–14, 1988, pp. 385–401.*

Whetsel, Lee, "Addressable Test Ports: An Approach to Testing Embedded Cores," 1999 ITC & TI Test Symposium, Sep. 28–30, 1999.*

Whetsel, Lee, "An IEEE 1149.1 Based Logic/Signature Analyzer in a Chip," International Test Conference 1991 Proceedings, Oct. 26–30, 1991.*

Whetsel, Lee, "IEE STD. 1149.1—An Introduction", NEPCON, Feb., 1993, 10 pages.*

Whetsel, Lee, "JTAG Compatible Devices Simplify Board Level Design For Testability," 8080 Wescon Conference Record 33 (1989) Nov., pp. 294–299.*

Zorian, Yervant; Jarwala, Najmi, "Designing Fault–Tolerant, Testable, VLSI Processors Uasing the IEEE P1149.1 Boundary Scan Architecture", $7^{th}$ IEEE International Conferenceon Computer Design: VLSI in Computers & Processors, Oct. 2–4, 1989.*

* cited by examiner

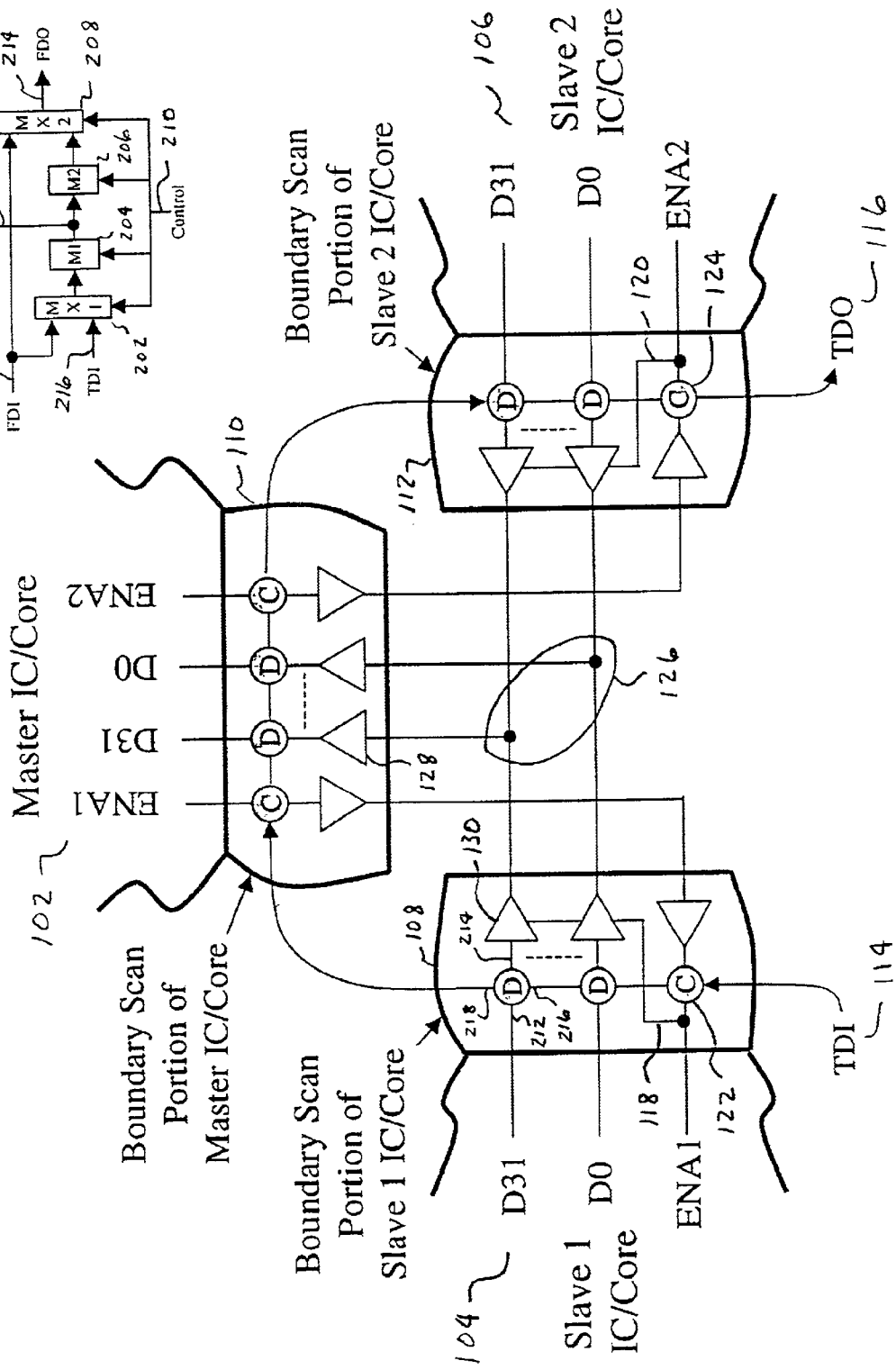

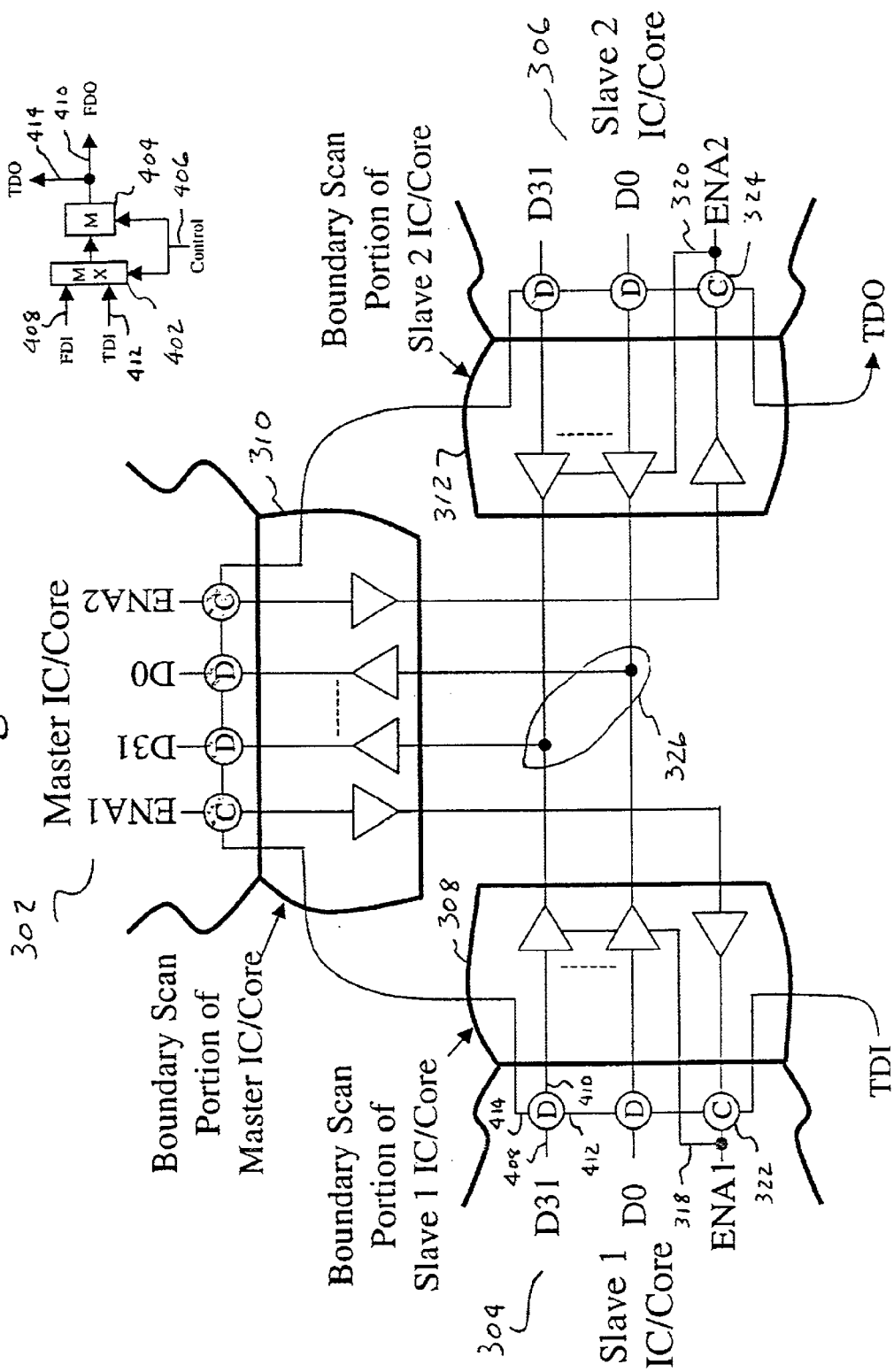

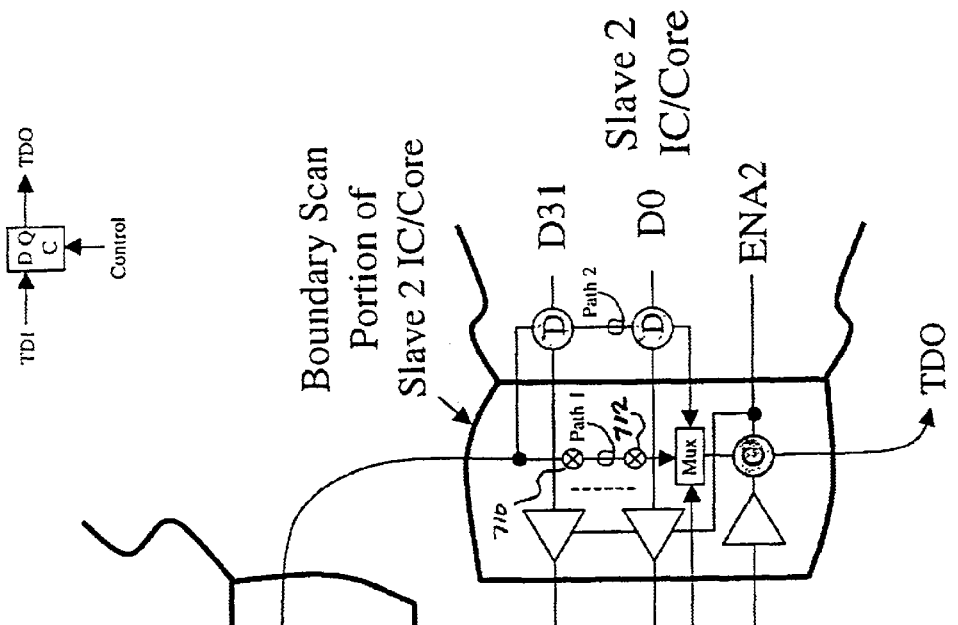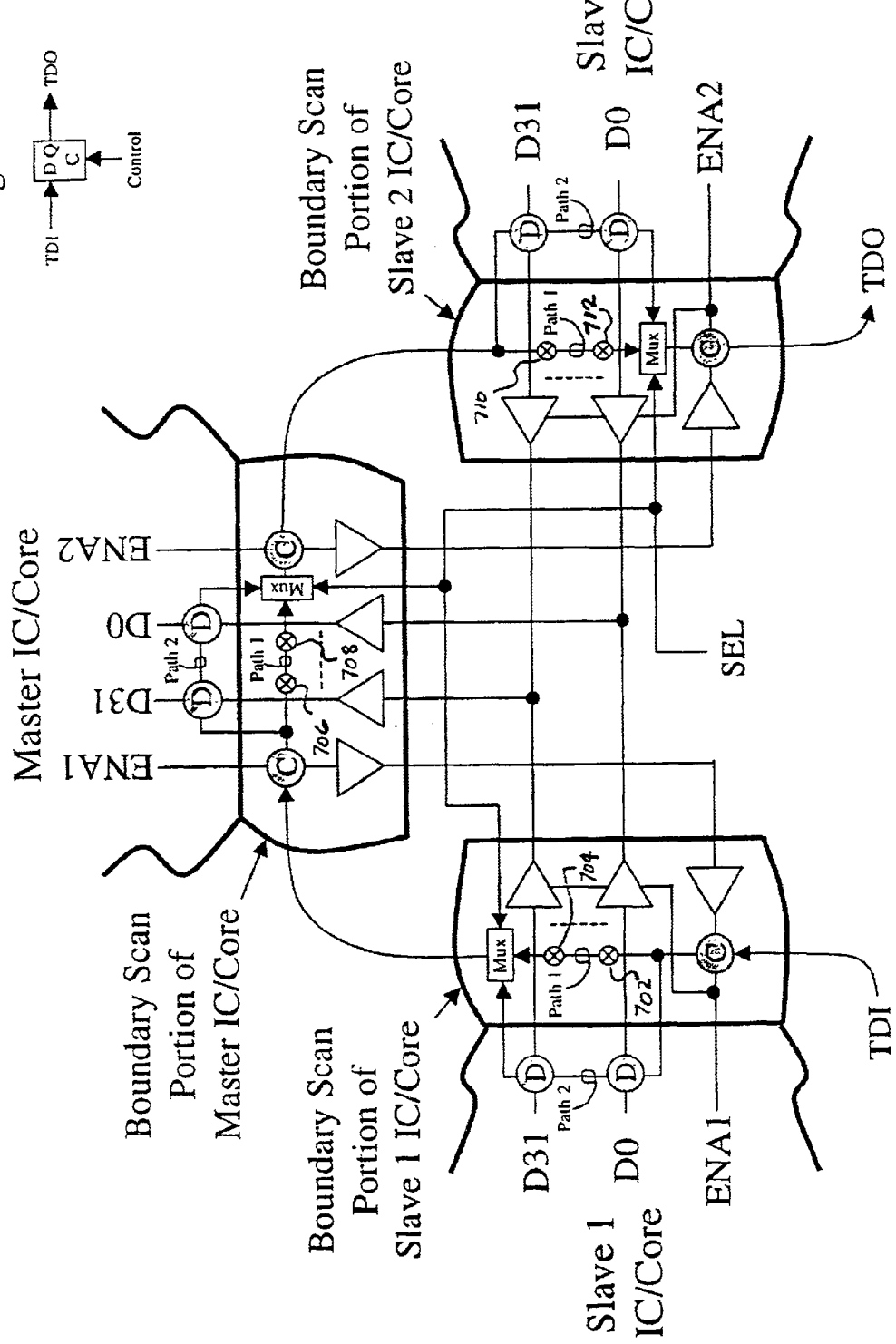

IC WITH SHARED SCAN CELLS SELECTIVELY CONNECTED IN SCAN PATH

This application claims priority under 35 USC § 119(e)(1) of provisional application No. 60/175,181, filed Jan. 10, 2000.

BACKGROUND OF THE INVENTION

In FIG. 1, a prior art example of a dedicated boundary scan path or register exists around a master circuit 102, a slave 1 circuit 104, and a slave 2 circuit 106. The master circuit, such as a DSP, CPU, or micro-controller, is a circuit that controls the slaves. The slave circuits are circuits being controlled by the master, such as RAM, ROM, cache, A/D, D/A, serial communication circuits, or I/O circuits. The master and slave circuits could exist as individual intellectual property core sub-circuits inside an integrated circuit or IC, or as individual ICs assembled on a printed circuit board or multi-chip module (MCM). The scan paths 108–112 around each circuit are connected together serially and to a test data input (TDI) 114, which supplies test data to the scan paths, and a test data output (TDO) 116, which retrieves data from the scan paths.

For simplification, only a portion of the scan paths 108–112 of each circuit is shown. The scan paths of FIG. 1 are designed using dedicated scan cells, indicated by capital letters (C) and (D) in circles. The word dedicated means that the cell's circuitry is used for testing purposes and is not shared for functional purposes. The scan cells are located between the internal circuitry and the input buffers 128 and output buffers 130 of the slaves and master circuit.

In FIG. 2, an example of a dedicated scan cell consists of multiplexer 1 (MX1) 202, memory 1 (M1) 204, memory 2 (M2) 206, and multiplexer 1 (MX2) 208. This scan cell is similar to scan cells described in IEEE standard 1149.1, so only a brief description will be provided. During operation in a functional mode, functional data passes from the functional data input (FDI) 212 to the functional data output (FDO) 214. In a functional mode, control inputs 210 to the scan cell can: (1) cause FDI data to be loaded into M1 via MX1 during a capture operation; (2) scan data from TDI 216 through MX1 and M1 to TDO 218 during a shift operation; and (3) cause data in M1 to be loaded into M2 during an update operation. Neither the capture, shift, nor update operation disturbs the functional data passing between FDI and FDO. Thus the scan cell of FIG. 2 can be accessed and pre-loaded with test data while the cell is in functional mode. The data scan cell (D) associated with the D31 output of slave 1 104 has connections corresponding to the FDI 212, TDI 216, FDO 214, and TDO 218 signal connections of the FIG. 2 scan cell.

During a functional mode of operation of the circuit in FIG. 1, data is transferred from one of the slaves to the master via a 32-bit data bus (D0–31), indicated by the wired bus connections 126. In a functional mode the scan cells are transparent, allowing functional control and data signals to pass freely through the cells. In this example, the master enables slave 1 to transfer data by the ENA1 control signal, which is output from the master to slave 1. Likewise the master enables slave 2 to transfer data by the ENA2 control signal, which is output from the master to slave 2. While only two slave circuits are shown, any number could be similarly connected to and operated by the master. Since all the scan cells of the scan paths 108–112 are dedicated for test, they can be scanned from TDI to TDO without disturbing the functional mode of the FIG. 1 circuit.

As mentioned, being able to scan data into the scan paths during functional mode allows pre-loading an initial test pattern into the scan paths. The initial test pattern establishes both a data test pattern in the data scan cells (D) and a control test pattern in the control scan cells (C). By pre-loading an initial test pattern into the scan paths, the circuits can safely transition from a functioning mode to a test mode without concern over bus contention between the slave circuit's data busses. For example, the ENA1 122 and ENA2 124 control scan cells (C) can be pre-loaded with control data to insure that only one of the slave's D0–31 data busses is enabled to drive the wired bus connection 126. Maintaining output drive on one of the slave data busses upon entry into test mode prevents the wired data bus 126 from entering into a floating (i.e. 3-state) condition. Preventing bus 126 from floating is desirable since a floating input to input buffers 128 of master 102 could cause a high current condition.

When test mode is entered, functional operation of the master and slave circuits stop and the scan cells in the scan paths take control of the master and slave circuit's data and control signal paths. A data scan cell (D) exists on each of the 32-bit data signal paths of each circuit 102–106, and a control scan cell (C) exists on each of the ENA1 and ENA2 control paths of each circuit 102–106.

Having dedicated data and control scan cells located as shown in FIG. 1, enables safe test entry and easy interconnect testing of the wiring between the master and slave circuits when the scan paths are placed in test mode. During interconnect test mode, a capture, shift, and update control sequence, such as that defined in IEEE standard 1149.1, can be used to control the scan paths.

To prevent contention between slave 1 and slave 2 data outputs 126 during the capture, shift, and update control sequence, the 3-state control outputs 118–120 of the ENA1 and ENA2 control scan cells 122–124 do not ripple during the capture and shift part of the control input sequence. This is accomplished by having the data in M2 of FIG. 2 be output, via MX2, during the capture and shift operation. Only during the update part of the control input sequence are the outputs 118–120 of the control scan cells 122–124 allowed to change state by new data being loaded into M2. Similarly, the outputs from the data scan cells (D) do not ripple during capture and shift operations, but rather change state only during the update part of the control input sequence.

In FIG. 3, a prior art example of a shared boundary scan path exists around a master 302 and slave circuits 304–306. As in FIG. 1, the scan paths 308–312 around each circuit are connected together serially and to a test data input (TDI), which supplies test data to the scan paths, and a test data output (TDO), which retrieves data from the scan paths. The scan paths of FIG. 3 are designed using shared scan cells (C) and (D), i.e. the scan cell memory is shared for both test and functional purposes. As an aid to indicate use of shared scan cells as opposed to dedicated scan cells, the shared scan cells of FIG. 3 and subsequent figures are shown positioned outside the boundary scan paths 308–312 and in the functional circuits. The dedicated scan cells of FIG. 1 were shown positioned inside the boundary scan paths 108–112. Again, for simplification, only a portion of each circuit's boundary scan path is shown.

In FIG. 4, an example of a conventional shared scan cell consists of a multiplexer (MX) 402 and a memory (M) 404. During a functional mode of operation, control inputs 406 form a path between FDI 408 and the data input of M 404 via MX 402, to allow functional data to be clocked from FDI to FDO 410. During a test mode, the control inputs 406 cause FDI data to be clocked into M via MX during a capture operation, and cause test data to be clocked from TDI 412 to TDO 414 during a shift operation. Since M 404 is used functionally, it cannot be accessed and pre-loaded with test data as can the scan cell of FIG. 2. Thus the ability to access and pre-load test data while the master and slave circuits of FIG. 3 operate functionally is one of the key distinctions between dedicated (FIG. 2) and shared (FIG. 4) scan cells.

In FIG. 3, the data scan cell associated with the D31 output of slave 1 304 is labeled to indicate the FDI 408, TDI 412, FDO 410, and TDO 414 signal connections of the FIG. 4 scan cell.

During the functional mode of the circuit in FIG. 3, as in FIG. 1, data is transferred from one of the slaves to the master via the 32-bit data bus (D0–31) through shared connections 326. The master enables data transfer from slave 1 or slave 2 via the ENA1 and ENA2 control signals, respectively. Since the scan cells of the scan paths are shared and used functionally, they cannot be scanned from TDI to TDO without disturbing the functional mode of the circuits. Not being able to scan data into the scan paths during functional mode prevents pre-loading an initial test pattern into the scan paths.

By not being able to pre-load an initial test pattern into the scan paths, the slave circuits are put at risk of not safely transitioning into the test mode from the functional mode. This situation occurs due to the timing domains of the functional and test modes not being synchronous to one another, which results in asynchronous functional to test mode switching.

For example, if the circuits of FIG. 3 switched from the functional mode timing domain to a test mode timing domain, a possibility exists that the D0–31 output buffers of slave 1 and 2 could both be enabled as a result of an asynchronous mode switch that caused scan cell ENA1 322 and scan cell ENA2 324 to both output enable conditions on wires 318 and 320. This would force a voltage contention situation between slave 1 and 2, resulting in the output buffers being damaged or destroyed. This voltage contention situation does not occur in the boundary scan path of FIG. 1 since an initial safe test pattern is preloaded into the scan cells prior to the functional to test mode switching step.

Once in a test mode, the scan path of FIG. 3 can be accessed to shift in test data. During shift operations the outputs 318–320 of the control scan cells 322–324 ripple as data shifts through the cells. This output ripple from the control scan cells can cause the D0–31 output buffers of the slaves to be enabled and disabled during the shift operation. This control output ripple causes the output buffers of slaves 1 and 2 to be simultaneously enabled, again creating bus contention between the slaves. This voltage contention situation does not occur in the boundary scan path of FIG. 1 since M 206 maintains a safe control output, via MX 208, during shift operations.

In FIG. 5, one prior art technique prevents the above-mentioned two voltage contention situations. The technique is based on providing additional circuitry and control inputs to enable or disable the slave's output buffers during test mode entry and again during each test mode shift operation. A signal gating circuit 528 is inserted into signal path 518 of slave 504 and a signal gating circuit 530 is inserted into signal path 520 of slave 506. A control signal C1 532 is added as an input to circuits 528 and 530. When C1 is in a first state, the ENA1 and ENA2 outputs from scan cells 522 and 524 are allowed to pass through circuits 528 and 530 to enable or disable the output buffers of slaves 504 and 506. However, when C1 is in a second state, the outputs of circuits 528 and 530 are forced, independent of ENA1 and ENA2, to disable the output buffers of slaves 504 and 506. By controlling C1 to the second state during the transition from functional mode to test mode, the first above mentioned voltage contention situation can be avoided. By again controlling C1 to the second state during each shift operation that occurs during test mode, the second above mentioned voltage contention situation can be avoided.

While the technique described above solves the voltage contention situations, it does so by introducing a floating (i.e. 3-state) condition on data bus 526. As described above, the output buffers of slaves 504 and 506 are disabled during test mode entry and during each shift operation. With the output buffers disabled, data bus 526 is not driven and may float to a voltage level that could turn on both input transistors of the input buffers of master 502. This could result in a low impedance path between the master's supply and ground voltages, potentially damaging or destroying the input buffers of master 502.

BRIEF SUMMARY OF THE INVENTION

This invention provides a boundary scan system where memories, i.e. flip flops or latches, used in data scan cells are also used functionally, but memories used in control scan cells are dedicated for test and not used functionally. The control scan cells can be scanned while the circuit is in functional mode, since their memories are dedicated. However, the data scan cells can only be scanned after the circuit transitions into test mode, since their memories are shared. This boundary scan system advantageously provides: (1) lower test circuitry overhead since the data scan cells use shared memories; (2) safe entry into test mode since the control scan cells can be scanned during functional mode to pre-load safe control conditions; and (3) avoidance of floating (i.e. 3-state) busses that can cause high current situations.

BRIEF DESCRIPTION OF THE SEVERAL VIEWS OF THE DRAWING

FIG. 1 is a simplified block diagram of a known boundary scan path around a master IC/core and two slave IC/cores;

FIG. 2 is a schematic diagram of a known dedicated scan cell;

FIG. 3 is a simplified block diagram of a known shared boundary scan path around a master IC/core and two slave IC/cores;

FIG. 4 is a schematic diagram of a known shared scan cell;

FIG. 7 illustrates the boundary scan system of FIG. 6 modified to include additional memories in the scan path;

FIG. 8 is a schematic diagram of re-synchronization memories; and

DETAILED DESCRIPTION OF THE INVENTION

Figure 5:
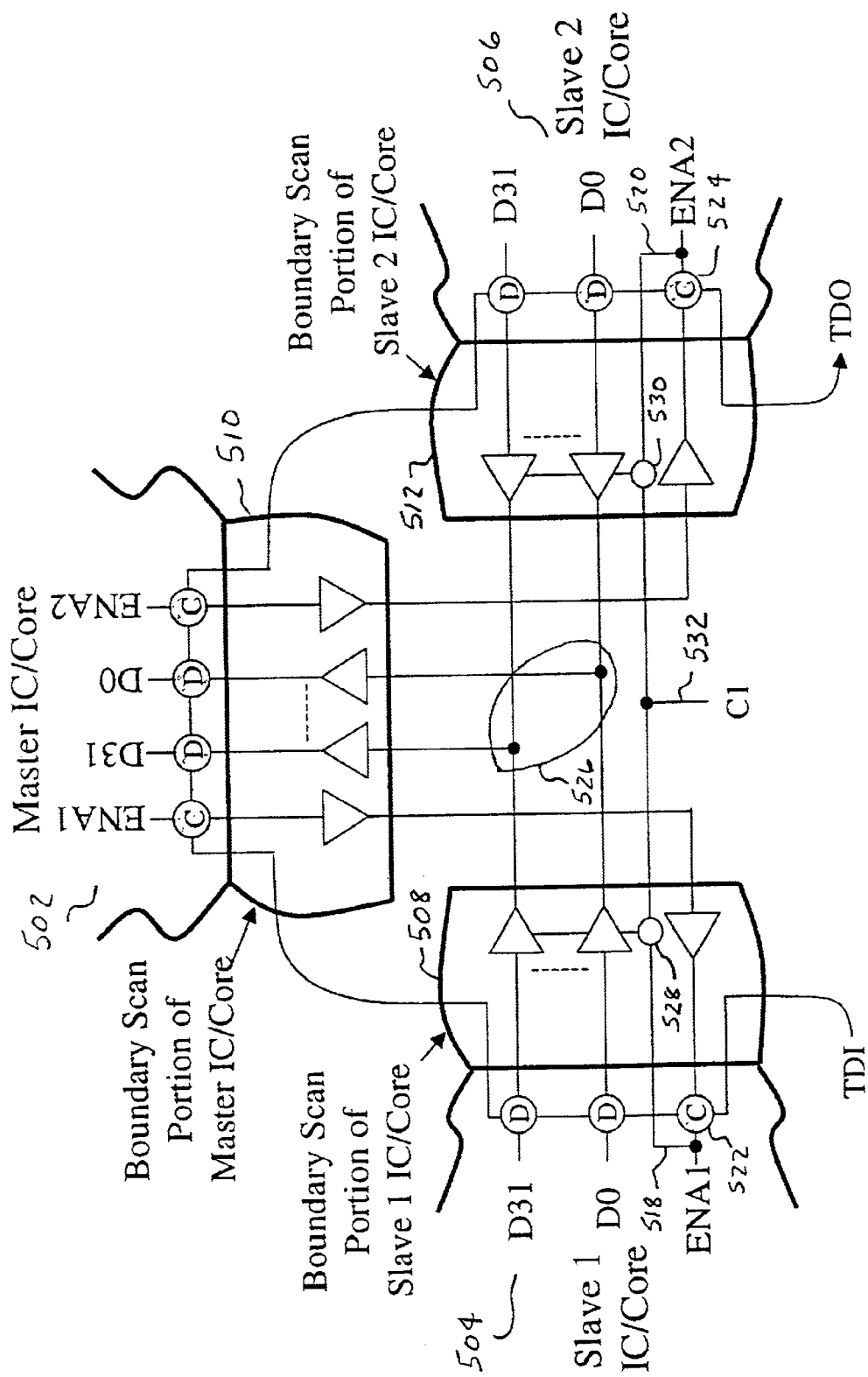
FIG. 5 is a simplified block diagram of a known boundary scan path around a master IC/core and two slave IC/cores with additional circuits to avoid voltage contention situations.
Figure 6:
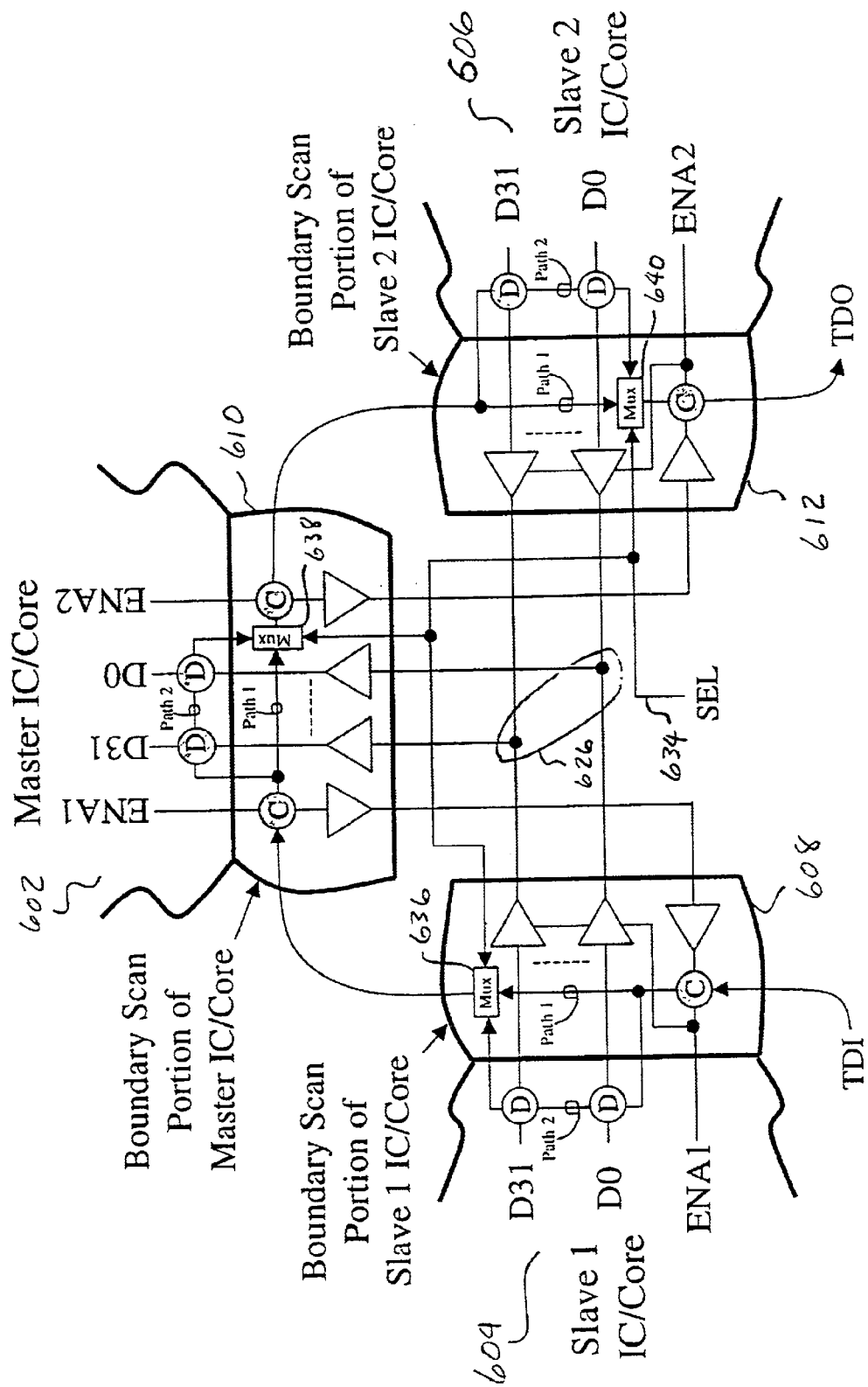
FIG. 6 is a simplified block diagram of a boundary scan path around a master IC/core and two slave IC/cores according to the invention.

In FIG. 6, a boundary scan system according to the present invention comprises a master circuit 602 operable to receive data transmitted from two slave circuits 604–606. The circuits 602–606 each have a boundary scan path 608–612, a portion of which is shown. The scan paths around each circuit are connected together serially and to TDI, which supplies test data to the scan paths, and TDO, which retrieves data from the scan paths. A first difference between the known scan paths and the scan path of FIG. 6 is that the control scan cells (C) of the scan paths in FIG. 6 are designed as dedicated scan cells, and the data scan cells (D) are designed as shared cells. A second difference is that the scan path has two configurations. In one configuration, the control cells reside on a serial path (path 1) separate from the serial path (path 2) on which the data scan cells reside. In another scan configuration, the control scan cells reside on the same serial path (path 2) on which the data scan cells reside.

Multiplexers 636–640 are provided for selecting the serial paths (path 1) to be connected serially together between TDI and TDO, or for selecting the serial paths (path 2) to be connected serially together between TDI and TDO. Control for the multiplexers to select a configuration of either path 1 or path 2 between TDI and TDO comes from a SEL signal, which is connected to the select input of each multiplexer 636–640.

If the master and slave circuits and their associated boundary scan paths are realized as embedded cores within an IC, the SEL signal 634 may come from an IEEE 1149.1 instruction register on the IC, another register or circuit on the IC, or from an input pin on the IC. However, if the master and slave circuits and their associated boundary scan paths are realized as separate ICs on a board or MCM, the SEL signal may come from an IEEE 1149.1 instruction register on each of the ICs, another register or circuit on each of the ICs, or from an input pin on each of the ICs. In the case, where the master and slaves are separate ICs and where the SEL signal comes from an IEEE 1149.1 instruction register, or another register or circuit, on each IC, the SEL signal will not be bussed to the same wire 634 as shown in FIG. 6, but rather individual SEL signal wires will exist between the IEEE 1149.1 instruction register, or another register or circuit, and multiplexers 636–640 on each of the individual ICs.

During a functional mode of operation of the circuit in FIG. 6 data is transferred from one of the slaves to the master via the 32-bit data bus (D0–31) on connections 626. The master enables data transfer from slave 1 or slave 2 via the ENA1 and ENA2 control signals, respectively. Since the data scan cells of the scan paths are shared and used functionally, they cannot be scanned from TDI to TDO without disturbing the functional mode of the circuits. However, since the control scan cells of the scan paths are not shared, they can be scanned from TDI to TDO without disturbing the functional mode of the circuit.

By scanning the control scan cells by themselves, via path 1, it is possible to pre-load, while the master and slave circuits are functioning, a control test pattern into the control scan cells. This control test pattern can be advantageously used to establish the test mode state of the slave data busses to insure that no contention between the data busses occurs upon switching from functional mode to test mode. For example, a control test pattern may be scanned into the control scan cells via path 1 to, upon entry into test mode, enable slave 1's data bus and disable slave 2's data bus or to disable slave 1's data bus and enable slave 2's data bus. By designing the control scan cells as dedicated scan cells, and by selectively grouping only the control scan cells onto path 1 between TDI and TDO, it is possible to pre-load a control test pattern to safely transition into test mode without slave bus contention and without disabling both slave buses.

When a test mode is entered, functional operation of the circuits stop and the scan cells take control of the master and slave circuit's data and control signal paths. The state of the data scan cells will be unknown at the beginning of the test since they could not be scanned during functional mode. That is not a problem however since the known values scanned into the control scan cells prevent any contention on the data busses. After the test mode is entered, the multiplexers 636–640 are controlled to group both the control and data scan cells onto path 2. A first combined data and control scan cell test pattern is then shifted into the scan path via path 2 and updated to start the test. The outputs of the control scan cells of FIG. 6 do not ripple during shift operations since they use the scan cell design of FIG. 2, thus bus contention between slaves is prevented during shift operations.

The outputs of the data scan cells do ripple during shift operation since they use the scan cell design of FIG. 4. However, this data ripple does not harm the circuit or cause bus contention since only one slave is enabled at a time to output data onto bus 626. While only two slave circuits 604 and 606, each with an associated boundary scan portions 608 and 612, were shown in FIG. 6, any number of slave circuits and associated boundary scan portions could be similarly connected to the master circuit 602 and associated boundary scan portion 610.

In FIG. 7, the boundary scan system of FIG. 6 includes additional memories 702–712 in the serial paths path 1. Depending upon the layout of the IC or core master and slave circuits, the wire running between the scan inputs and outputs of the control scan cells in path 1 may become long when bypassing a large number of shared data scan cells. If the wiring becomes to long the setup and hold times of the control scan cells may be violated, resulting in shift operation failures through path 1.

To prevent shift operation failures, one or more resynchronization memories 702–712 may be located in path 1 between the scan outputs and scan inputs of the control scan cells. The resynchronization memories, typically D flip flops as shown in FIG. 8, would be located in scan path 1 such that the control data shifted through path 1 passes through a shorter length of wiring between the control scan cells and resynchronization memories, thus managing the setup and hold timing for reliably shifting data through path 1.

If resynchronization memories are used, the bit length of path 1 will grow by the number of resynchronization memories. To compensate for this bit length growth, each test pattern shifted into path 1 will need to be augmented to include appropriately positioned resynchronization data bits during shift operations. In FIG. 7, the resynchronization memories 702–712 are not necessary when shift operations occur through path 2, since the shared data scan cells are not being bypassed. Thus scan path 2 does not include the resynchronization memories, and the test patterns shifted into scan path 2 advantageously do not need to be augmented to include the aforementioned resynchronization data bits.

Figure 9:
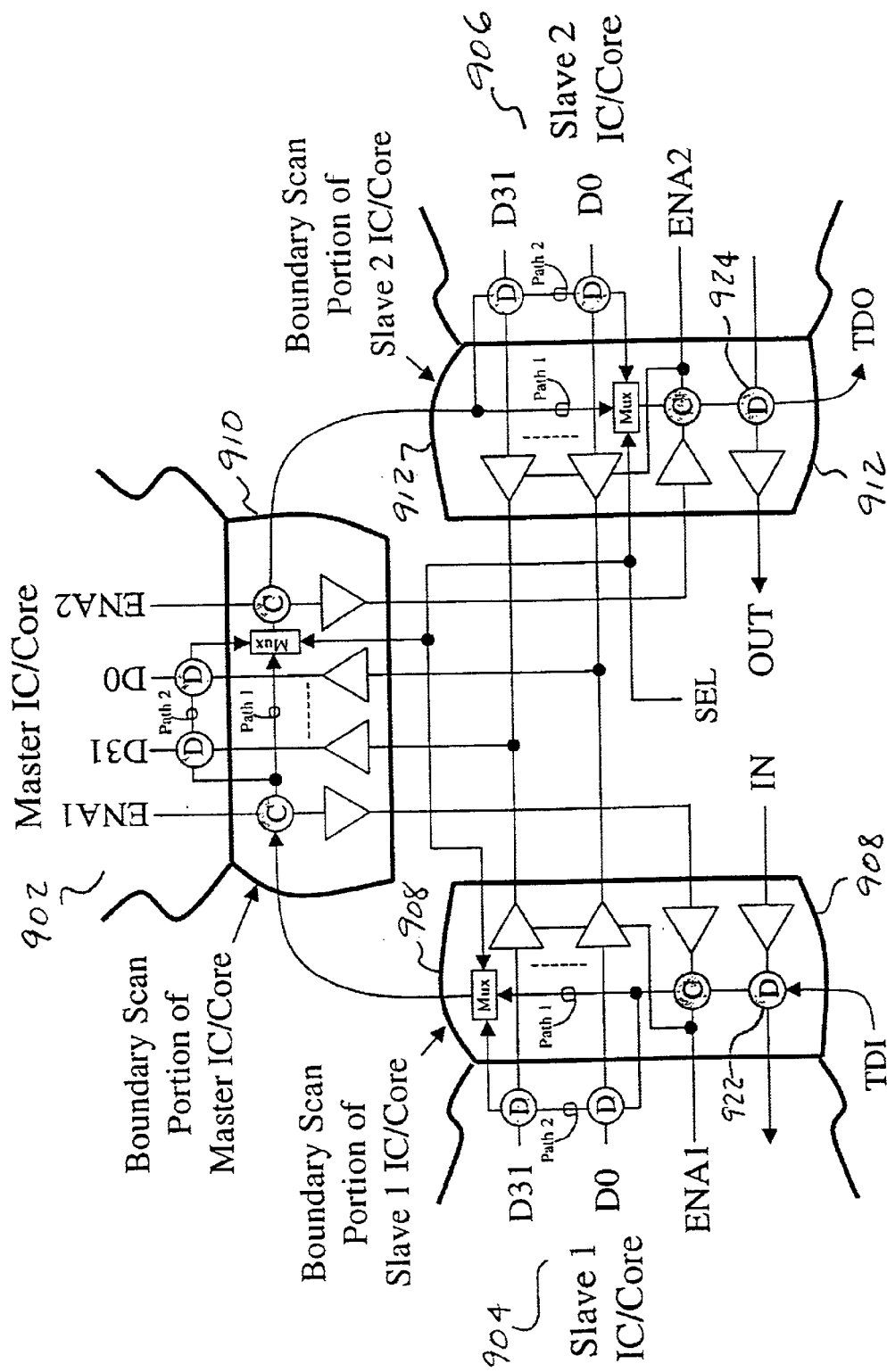
FIG. 9 is a simplified block diagram of a modified boundary scan path.

In FIG. 9, a boundary scan system consists of master circuit 902 and slave circuits 904 and 906. Boundary scan portion 908 of slave 904 is similar to boundary scan portion 608 of FIG. 6 with the exception that it includes an additional input (IN) to slave circuit 904 and an associated dedicated data scan cell 922. Also, boundary scan portion 912 of slave 906 is similar to boundary scan portion 612 of FIG. 6 with the exception that it includes an additional output (OUT) from slave circuit 906 and an associated dedicated data scan cell 924.

The arrangement of FIG. 9 indicates that dedicated data scan cells 922 and 924 (i.e. a scan cell similar to that of FIG. 2) can be included in both path 1 and path 2 shift operations. When the path 1 serial paths are selected between TDI and TDO, data can be shifted through the control scan cells (C) and the 922 and 924 data scan cells (D) of FIG. 9 during functional mode. When the path 2 serial paths are selected between TDI and TDO, data can be shifted through all the scan cells of FIG. 9, both shared and dedicated, during test mode.

While specific signal types, i.e. data and control, have been associated with shared and dedicated scan cells in FIGS. 6 and 9, it should be understood that in general shared and dedicated scan cells are independent of signal types. What is important is to associate dedicated scan cells with signal types that need to be preconditioned with data prior to entry into test mode. Shared scan cells, on the other hand, can be associated with signal types that do not need to be preconditioned with data prior to test mode entry.

The arrangements of FIGS. 6 and 9 and their accompanying descriptions have described a boundary scan path system consisting of groups of dedicated scan cells and groups of shared scan cells. Multiplexers within the boundary scan path system allow partitioning the boundary scan path to allow serial access to occur either to only the dedicated scan cell groups or to both the dedicated and shared scan cells groups. The ability to serially access dedicated scan cells within a boundary scan system independent of the shared scan cells, and while the functional circuits operate, advantageously allows loading certain key data signals which facilitate safe entry into test mode from the functional mode.

The arrangements of FIGS. 6 and 9 and their accompanying descriptions have also described a process for safely transitioning circuits and their associated boundary scans paths from their functional mode to test mode. The process can be summarized as: (1) configuring the boundary scan path system to contain only dedicated scan cells between TDI and TDO, (2) performing a shift operation to load data into the dedicated scan cells, (3) entering the boundary scan test mode, (4) configuring the boundary scan path system to contain all scan cells, both shared and dedicated, between TDI and TDO, and (5) performing a shift operation to load data into all the scan cells.

The arrangement of FIG. 7 and its accompanying description has described why resynchronization memories may be needed and how they may be used to register data transfers across bypassed sections of shared scan cells to resolve setup and hold timing problems that might exist between a sending and receiving dedicated scan cell.

Although the present invention has been described in accordance to the embodiments shown in the figures, one of ordinary skill in the art will recognize there could be variations to these embodiments and those variations should be within the spirit and scope of the present invention. Accordingly, modifications may be made by one ordinarily skilled in the art without departing from the spirit and scope of the appended claims.

I claim:

1. An integrated circuit comprising:

A. a first circuit having data input leads connected to the inputs of input data buffers, each input data buffer being subject to damage when all data input signals on a data input lead are placed in a high impedance state, the first circuit also having control output leads connected to the outputs of output control buffers;

B. a second circuit having first data output leads coupled to respective data input leads of the first circuit and having a first control input lead coupled to a control output lead of the first circuit, the first data output leads being connected to the outputs of data output tri-state buffers, each tri-state buffer having a tri-state control input for, when active, placing the output of the tri-state buffer in a high impedance output state, the first control input lead being connected to the input of a control input buffer, the output of the control input buffer being coupled to the tri-state control inputs of the tri-state buffers, the output of each tri-state buffer being subject to damage upon the output, when active, being driven to a logic level data output signal in contention with another driven logic level data output signal occurring at its data output lead;

C. a third circuit having second data output leads also coupled to respective data input leads of the first circuit and having a second control input lead coupled to a control output lead of the first circuit, the second data output leads being connected to the outputs of data output tri-state buffers, each tri-state buffer having a tri-state control input for, when active, placing the output of the tri-state buffer in a high impedance output state, the second control input lead being connected to the input of a control input buffer, the output of the control input buffer being coupled to the tri-state control inputs of the tri-state buffers, the output of each tri-state buffer being subject to damage upon the output, when active, being driven to a logic level data output signal in contention with another driven logic level data output signal occurring at its data output lead; and F. a serial scan path passing through the first, second, and third circuits, the scan path having an scan input coupled to a serial test data input lead supplying test data and having an scan output coupled to a serial test data output lead retrieving test data, the scan path including dedicated scan cells and shared scan cells with one scan cell being coupled in series with one input buffer and one scan cell being coupled in series with one output buffer, each dedicated scan cell including two memories for shifting test data on the scan path without interfering with normal operation of the first, second, and third circuits, each shared scan cell including one memory that is shared for normal and test operation of the first, second, and third circuits and shifting test data on the scan path through the shared scan cell interferes with normal operation of the first, second, and third circuits, the dedicated scan cells being always connected in the serial scan path and the shared scan cells being selectively connected in the serial scan path.

2. The integrated circuit of claim 1 in which the scan path includes multiplexers selectively connecting the shared scan cells in the scan path.

3. The integrated circuit of claim 1 in which the scan path includes multiplexers selectively connecting the shared scan cells in the scan path and a select lead extending to the multiplexers to control the selective connection.

4. The integrated circuit of claim 1 in which the first circuit is a master circuit, the second circuit is a slave circuit, and the third circuit is a slave circuit.

* * * * *